(12) United States Patent
Qi et al.

(10) Patent No.: US 11,982,709 B2
(45) Date of Patent: May 14, 2024

(54) METHODS AND STRUCTURES FOR SEMICONDUCTOR DEVICE TESTING

(71) Applicant: Yangtze Memory Technologies Co., Ltd., Wuhan (CN)

(72) Inventors: Lin Qi, Wuhan (CN); Xiaoqiong Du, Wuhan (CN); Juan Wang, Wuhan (CN); Jinyu Tong, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 175 days.

(21) Appl. No.: 17/749,815

(22) Filed: May 20, 2022

(65) Prior Publication Data
US 2023/0375616 A1 Nov. 23, 2023

(51) Int. Cl.
*G01R 31/28* (2006.01)
*H01J 37/30* (2006.01)
*H01J 37/305* (2006.01)
*H01J 37/317* (2006.01)

(52) U.S. Cl.
CPC ...... *G01R 31/2898* (2013.01); *H01J 37/3005* (2013.01); *H01J 37/305* (2013.01); *H01J 37/3178* (2013.01); *H01J 2237/31749* (2013.01)

(58) Field of Classification Search
CPC .................. G01R 33/1207; G11C 11/061
See application file for complete search history.

(56) References Cited

U.S. PATENT DOCUMENTS 6,963,136 B2 * 11/2005 Shinozaki ........... H01L 23/5286
257/E23.021
2008/0277148 A1 * 11/2008 Asai .................. H01L 23/49827
174/255

* cited by examiner

*Primary Examiner* — Tung X Nguyen
(74) *Attorney, Agent, or Firm* — Anova Law Group, PLLC

(57) ABSTRACT

A structure for performing analysis includes a first opening formed on a back side of a substrate and passing through the substrate, a second opening connected with a bottom of the first opening and penetrating into a first dielectric layer formed on a front side of the substrate, a first conductive layer formed on a sidewall of the second opening and a contact element in the first dielectric layer, and a second conductive layer formed on a second dielectric layer. The first conductive layer contacts the second conductive layer electrically.

20 Claims, 6 Drawing Sheets

METHODS AND STRUCTURES FOR SEMICONDUCTOR DEVICE TESTING

FIELD OF THE TECHNOLOGY

This application relates generally to the field of semiconductor technology and, specifically, to methods and structures for testing and diagnosing an integrated circuit (IC) of a semiconductor device.

BACKGROUND OF THE DISCLOSURE

Reduction of defects and failures improves the product yield and profitability of semiconductor devices. To locate and cure the sources of defects and failures, failure analysis is performed to investigate, troubleshoot, and debug a device. In failure analysis, an opening is milled at a precise location through the front side of a semiconductor die. After a metal layer of an integrated circuit (IC) is exposed in the opening, signals are detected at the metal layer to analyze problems of the IC.

SUMMARY

In one aspect of the present disclosure, a structure for performing analysis includes a first opening formed on a back side of a substrate and passing through the substrate, a second opening connected with a bottom of the first opening and penetrating into a first dielectric layer formed on a front side of the substrate, a first conductive layer formed on a sidewall of the second opening and on a contact element in the first dielectric layer, and a second conductive layer formed on a second dielectric layer. The second dielectric layer is formed on a sidewall of the first opening, and the first conductive layer contacts the second conductive layer electrically.

In another aspect of the present disclosure, a method for analyzing a semiconductor structure includes placing the semiconductor structure on a platform. The semiconductor structure includes a substrate. One or more functional objects are formed on a front side of the substrate. The front side and a back side of the substrate face oppositely along a direction approximately perpendicular to the substrate. The method further includes removing a portion of the substrate from the back side to form a first opening with a bottom surface at a bottom of the first opening, and forming a second opening on the bottom surface that extends through the substrate. The second opening exposes a surface of a dielectric region at a bottom of the second opening. The method further includes depositing a dielectric layer over the bottom surface of the first opening and a sidewall of the second opening, depositing a first conductive layer over the dielectric layer, and forming a third opening on the surface of the dielectric region that extends through a portion of the dielectric region. The third opening exposes a surface of a contact element at a bottom of the third opening. The method further includes depositing a second conductive layer on the contact element and the first conductive layer to connect the contact element and the first conductive layer electrically.

In another aspect of the present disclosure, a semiconductor structure includes a substrate, a functional region including a functional object formed on a front side of the substrate, a non-functional region formed on the front side of the substrate, a dielectric region formed over the non-functional region, a conductive layer in the dielectric region for interconnection of the functional object, and a contact element. The contact element includes a conductive material. The contact element is located in the dielectric region, connected with the conductive layer electrically, and aligned with the non-functional region along a direction approximately perpendicular to the substrate. The contact element and the non-functional region are separated by a portion of the dielectric region along the direction approximately perpendicular to the substrate. The width of the contact element is larger than that of a portion of the conductive layer.

Other aspects of the present disclosure can be understood by those skilled in the art in light of the description, the claims, and the drawings of the present disclosure.

DETAILED DESCRIPTION

The following describes the technical solutions according to various aspects of the present disclosure with reference to the accompanying drawings. Wherever possible, the same reference numbers will be used throughout the drawings to refer to the same or like parts. Apparently, the described aspects are merely some but not all of the aspects of the present disclosure. Features in various aspects may be exchanged and/or combined.

Figure 1A:
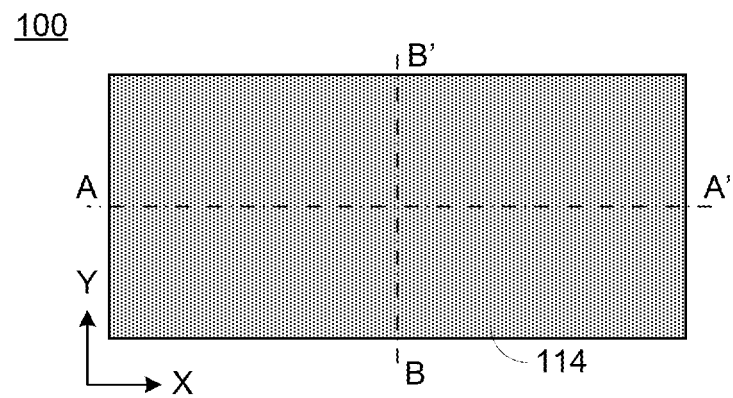
FIGS. 1A, 1B, and 1C are top and cross-sectional views of a semiconductor device.
Figure 1B:
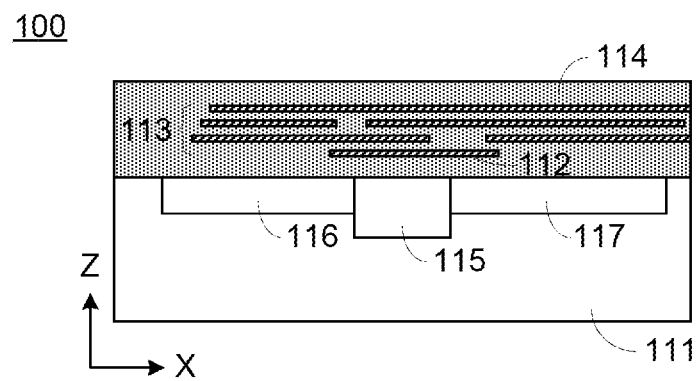
Figure 1C:
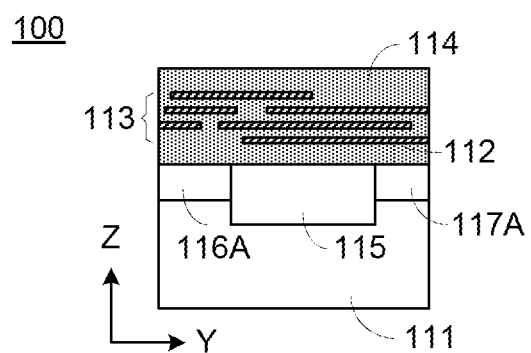

FIGS. 1A, 1B, and 1C show top and cross-sectional views of an exemplary semiconductor device 100. The top view shown in FIG. 1A is in an X-Y plane. The cross-sectional views shown in FIGS. 1B and 1C are in an X-Z plane and Y-Z plane, and taken along lines AA' and BB' of the top view, respectively. The semiconductor device 100 may also be referred as a semiconductor die, semiconductor chip, or semiconductor structure. The views in FIGS. 1A-1C may reflect a part of the semiconductor device 100. The device 100 includes a substrate 111 that may include single crystalline silicon, germanium (Ge), silicon-germanium (SiGe), silicon carbide (SiC), silicon-on-insulator (SOI), germanium-on-insulator (GOI), polysilicon, or a Group III-V compound such as gallium arsenide (GaAs) or indium phosphide (InP). Certain integrated circuits (ICs) (not shown) may be fabricated on the substrate 111. For example, the ICs may include metal-oxide-semiconductor field-effect transistors (MOSFETs) that form CMOS circuits and provide certain devices such as processors, amplifiers, and controllers. The device 100 includes a metal layer 112 among multiple metal layers 113 that are formed in a dielectric region 114. As used herein, the terms "metal layer", "metal interconnect layer", and "metal line" indicate a conductive layer made of one or more metallic materials and extending in an X-Y plane or a plane approximately parallel to the substrate 111. The one or more metallic materials may include copper (Cu), aluminum (Al), tungsten (W), titanium (Ti), cobalt (Co), tantalum (Ta), or a combination thereof.

The metal layers 113 may include metal layers disposed at different levels and stacked along the Z direction. The dielectric region 114 may contain one or more dielectric materials (e.g., silicon oxide or silicon nitride) and may also be considered as a dielectric layer. In some embodiments, the device 100 may include a non-functional region 115 and functional regions 116, 116A, 117, and 117A. The functional regions 116, 116A, 117, and 117A may be parts of one functional region. In some cases, these functional regions may be isolated from each other electrically. The term "functional region" as used herein indicates a region in a substrate where one or more functional objects are formed. Functional objects may include, for example, parts or components of an IC or an IC, such as a MOSFET, a resistor, a capacitor, a metal line, an IC device, etc. Functional objects may also include certain semiconductor devices formed on a substrate such as a photodetector and micro-electromechanical system (MEMS). The term "non-functional region" as used herein indicates a region in a substrate that does not have any functional object but a function of electrical insulation. A non-functional region may be disposed proximate or adjacent to a functional region along one or more directions approximately parallel to the substrate, and have no functional region formed above or beneath it along a direction approximately perpendicular to the substrate. In some cases, a non-functional region may be used to separate functional regions or isolate a functional region in directions approximately parallel to the substrate. For example, a region of shallow trench isolation (STI) and an undoped portion of a single crystalline silicon substrate outside a functional region are non-functional regions.

For the substrate 111 or semiconductor device 100, the side of the substrate 111 where the functional and non-functional regions are formed may be referred to as the front side (or upside), and the other side (i.e., the opposite side) of the substrate 111 may be referred to as the back side (or downside). As such, the metal layers 113 are deposited over the front side of the substrate 111. The front side and back side of the substrate 111 face oppositely along a direction approximately perpendicular to the substrate.

In some cases of failure analysis, an opening is etched to expose a metal layer from the front side of a substrate. As the structural complexity of ICs grows exponentially, the width of metal layer decreases, while the number of metal layer levels increases. When a target metal layer lies beneath other metal layers, it is difficult to reach it from the front side of the substrate. Consequently, high-performance equipment may be required to cut some metal layers to form an opening and repair the metal layers afterwards. In some cases, the front side of a substrate is bonded with a package or a semiconductor structure. Then, reaching a metal layer from the front side becomes almost impractical.

FIGS. 2A-8B schematically show processes to expose the metal layer 112 of the semiconductor device 100 from the back side according to aspects of the present disclosure. Among the figures, cross-sectional views are in an X-Z plane and top views are in an X-Y plane. The cross-sectional views are taken along a line CC' of the top views, respectively. In descriptions below, the substrate 111 contains single crystalline silicon exemplarily.

Figure 2A:
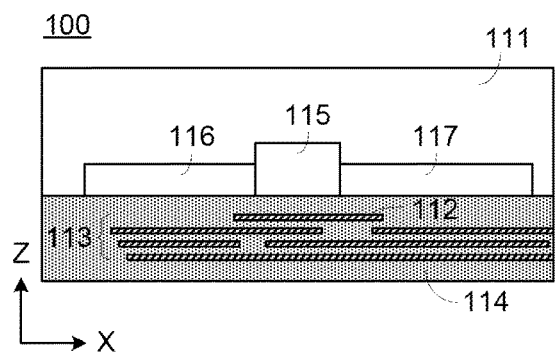
FIGS. 2A-8B are cross-sectional views and top views of the semiconductor device shown in FIGS. 1A-1C illustrating methods to expose a metal layer or contact element according to various aspects of the present disclosure.
Figure 2B:
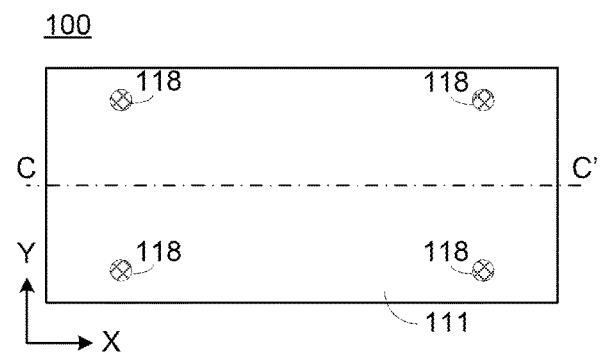

As shown in FIGS. 1B-1C, there are several metal layers above the metal layer 112, making it complicated to reach the layer 112 from the front side. In FIGS. 2A and 2B, the device 100 is turned upside down such that the back side of the substrate 111 faces upwards along the Z direction. The device 100 is placed and fixed on a platform (or a fixture) (not shown). In some cases, the thickness of the substrate 111 is about 400-800 micrometers. In these cases, the substrate 111 may be thinned over the entire surface of the back side. For example, the thickness of the substrate 111 may be reduced to around 100 micrometers. Optionally, a thinning process may be performed when the substrate is thicker than a predetermined value (e.g., about 100 micrometers), and the substrate may be thinned until its thickness is around the predetermined value. Further, the surface of the back side is polished and planarized for subsequent processes.

As the substrate 111 may be silicon that is not transparent for the visible light, infrared (IR) optical microscope (not shown) may be used to observe features of the device 100 through the substrate from the back side. The microscope may have an IR light source with wavelengths longer than 0.9 micrometer (e.g., 0.9-1.9 micrometers). After comparing images taken by the microscope and the layout of the ICs of the device 100, an approximate location of the metal layer 112 and a target area on the planarized surface are determined. For example, the target area may have a rectangular or square shape and the center of the target area may be approximately aligned with the metal layer 112 along the Z direction.

Figure 3A:
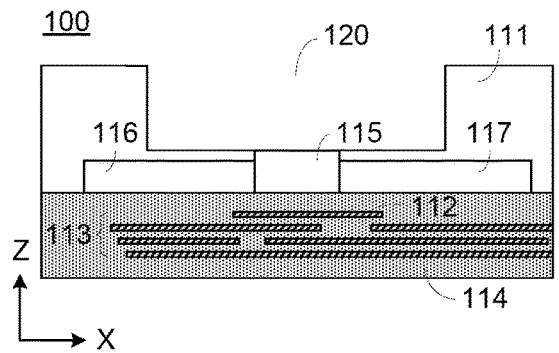
Figure 3B:
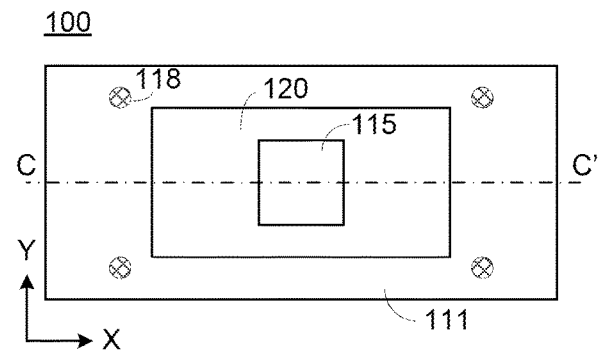

Further, marks 118 are made on the planarized surface with, e.g., an engraving method. For example, a laser marker may be used to etch the planarized surface to create the marks 118. In some embodiments, the marks 118 may be positioned close to the four corners of the target area. Further, a cutting process may be performed to cut into the planarized surface, creating an opening 120 on the back side of the substrate 111, as shown in FIGS. 3A and 3B. The opening 120 may be positioned based on the target area.

In certain embodiments, a focused ion beam (FIB) system or a plasma FIB (PFIB) system may be used to form the opening 120 by milling. An FIB system may also be referred to as an FIB workstation or FIB. In some cases, an FIB system may use gallium ions (Ga$^+$), and a PFIB system may use certain heavier ions such as xenon ions (Xe$^+$). An FIB system may be used to provide localized material removal and deposition with nanometer-level precision, while a PFIB system may provide a faster milling speed (e.g., several times faster) than an FIB system and is often used to mill a relatively large area. In certain cases, the lateral dimensions of the opening 120 in an X-Y plane are about 100-300 micrometers. In these cases, a PFIB system may be employed to remove a portion of the substrate 111, creating the opening 120 from the back side. In certain embodiments, other methods may also be used to perform the cutting process. For example, a lithographical process may be used to form the opening 120.

The depth of the opening 120 is arranged such that the opening 120 does not expose or disturb functional regions such as functional regions 116 and 117 in some cases. Optionally, a surface of the non-functional region 115 may be exposed in the opening 120, as shown in FIGS. 3A-3B. Alternatively, the non-functional region 115 may be beneath the bottom surface of the opening 120 and not exposed by the opening. In some embodiments, the opening 120 may be milled such that the distance between the bottom surface of the opening 120 and the dielectric region 114 is around a predetermined value, such as 1-4 micrometers.

The depth of the opening 120 may be monitored and measured using an optical method (e.g., an optical interferometric method). Alternatively, the depth of the opening 120 may be monitored and measured using a dummy semiconductor chip. The dummy semiconductor chip has a substrate made of single crystalline silicon. The substrate 111 and the dummy chip may be milled together. Then, measurement results made on the dummy chip may be used to estimate the depth of the opening 120. As the thickness of the substrate 111 may be obtained before the milling process, the distance between the bottom surface of the opening 120 and the dielectric region 114 may be calculated using the depth value.

Figure 4A:
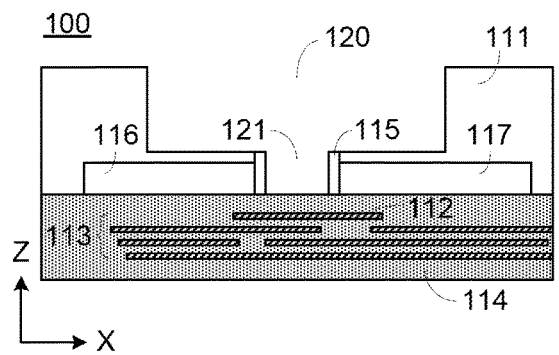
Figure 4B:
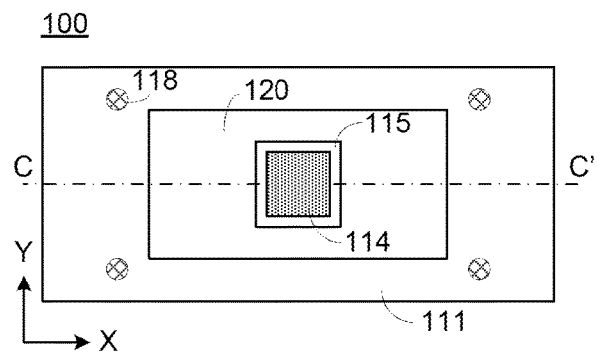

Further, an opening 121 is formed on the bottom surface of the opening 120 that extends through the substrate 111 and exposes a surface of the dielectric region 114, as shown in FIGS. 4A and 4B. The opening 121 is connected with the bottom of the opening 120. The opening 121 may be made using, e.g., an FIB system. Before milling the opening 121, the IR optical microscope and a regular optical microscope (i.e., a microscope using the visible light) are used to take images through the opening 120. The images obtained by the microscopes and the layout of the ICs of the device 100 are utilized to identify and determine the location of the metal layer 112, from which the location of the opening 121 is determined.

The metal layer 112 may be selected because it is aligned with the non-functional region 115. Optionally, the metal layer 112 may be intentionally aligned to the non-functional region 115 when the ICs of the device 100 are designed. In addition, it is configured such that the opening 121 passes through the non-functional region 115 and does not disturb the functional regions (e.g., the functional regions 116 and 117) adjacent or proximate to it. In some embodiments, the opening 121 is disposed within the boundary line of the non-functional region 115 in an X-Y plane and does not expose any functional region proximate to the opening 121.

Figure 5A:
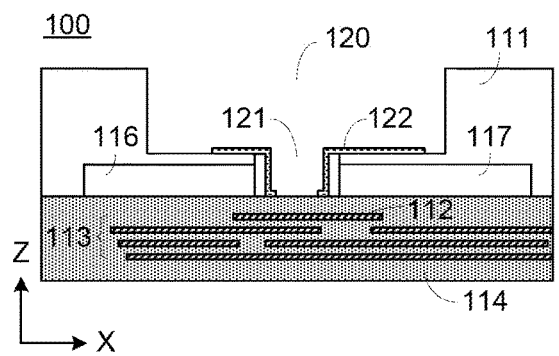
Figure 5B:
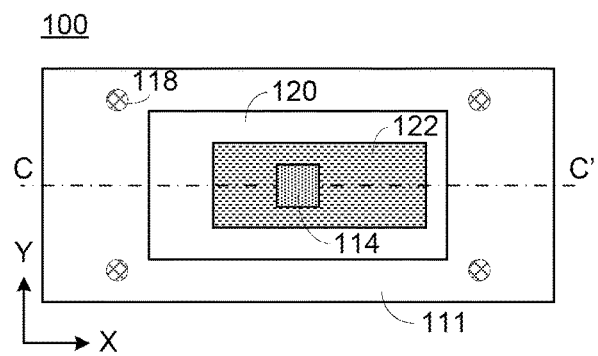

Further, a dielectric layer 122 is deposited using an FIB system and certain mixed gas or precursor gas. The deposition process may be referred to as FIB-assisted deposition. As shown in FIGS. 5A and 5B, the dielectric layer 122 is grown on the sidewall of the opening 121 and on some portions of the bottom surface of the opening 120 that are proximate to the opening 121. In some cases, the dielectric layer 122 may have a thickness about 20-100 nanometers, and the dimensions of at least one portion of the layer 122 on the bottom surface of the opening 120 may be about 5-30 micrometers along the X and Y directions in an X-Y plane. The at least one portion of the layer 122 may be used as a site for a probe pad. The layer 122 contains one or more dielectric materials (e.g., silicon oxide or silicon nitride).

Figure 6A:
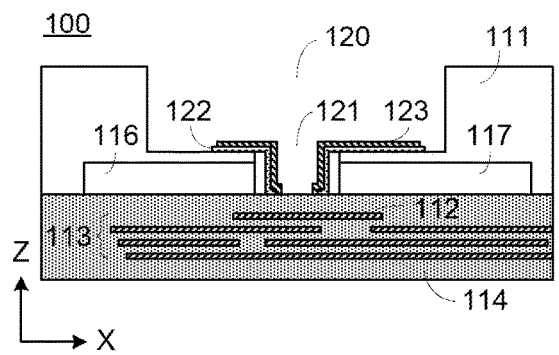
Figure 6B:
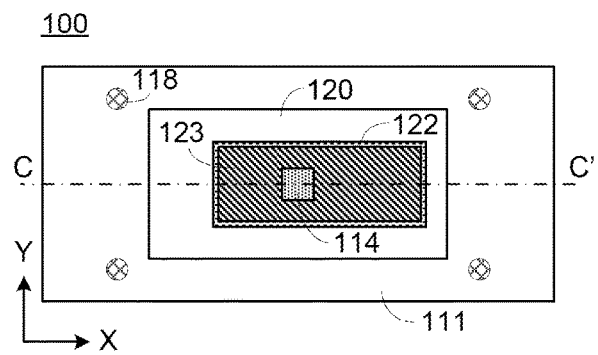

Further, another FIB-assisted deposition is performed to grow a first conductive layer 123 over the dielectric layer 122, as illustrated in FIGS. 6A and 6B. A part of the first conductive layer 123 covers the layer 122 on the sidewall of the opening 121. On the bottom surface of the opening 120, the first conductive layer 123 overlaps a part of the dielectric layer 122, but does not extend beyond the layer 122 so that the first conductive layer 123 does not contact the substrate 111. Optionally, at the bottom of the opening 121, the first conductive layer 123 may be deposited on a part of the surface of the dielectric region 114 adjacent to the layer 122 (i.e., adjacent to the sidewall of the opening 121), while the rest part of the surface of dielectric region 114 remains to be exposed and not covered by the layer 123. As used herein, the word "contact" as a verb indicates electrically contacting an object. The thickness of the first conductive layer 123 may be, for example, around 1 micrometer or larger than 1 micrometer. The layer 123 may include a metallic material such as W, Co, Cu, Al, or a combination thereof. A portion of the layer 123 on the bottom surface of the opening 120 will be used as a probe pad in failure analysis. Deposition of the first conductive layer 123 is performed while the metal layer 112 is covered by the dielectric region 114, which reduces damages caused by ions during the FIB-assisted process.

Figure 7A:
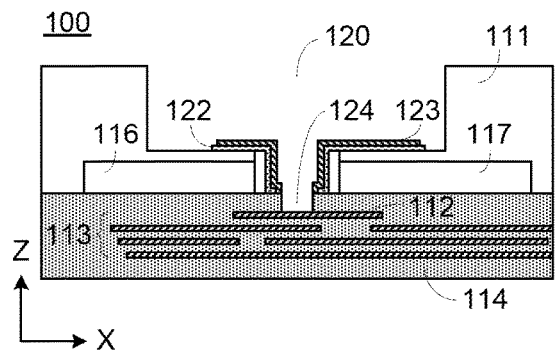
Figure 7B:
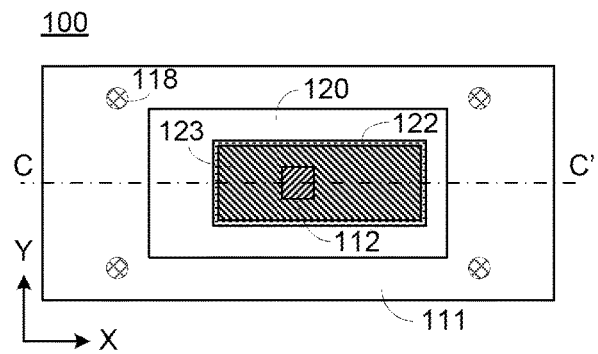

Referring to FIGS. 7A and 7B, an opening 124 is milled using, e.g., an FIB system. The opening 124 is formed at the bottom of the opening 121, i.e., on the surface of the dielectric region 114, connected with the bottom of the opening 121, and extends through a portion of the dielectric region 114 to reach and expose a surface of the metal layer 112. As such, the opening 124 is surrounded by a portion of the dielectric region 114 (or a dielectric material) in a plane approximately parallel to the substrate 111. The opening 124 overlaps the opening 121 along the Z direction, and is aligned with the metal layer 112 along the Z direction or a direction approximate perpendicular to the substrate 111.

Figure 8A:
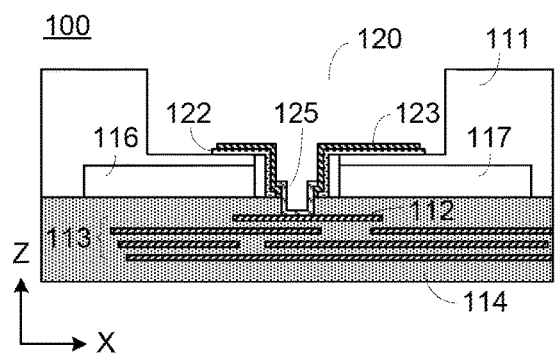
Figure 8B:
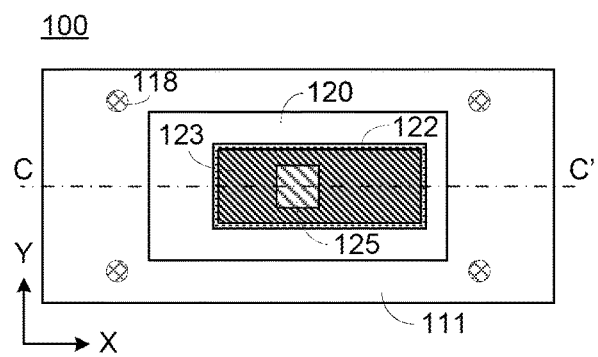

Further, a second conductive layer 125 is deposited on the exposed surface of the metal layer 112 and a part of the first conductive layer 123, as shown in FIGS. 8A and 8B. An FIB-assisted deposition may be performed. At the bottom of the opening 124, the second conductive layer 125 contacts the metal layer 112. In addition, the second conductive layer 125 covers and contacts a part of the first conductive layer 123 that is on the sidewall of the opening 121. As such, the second conductive layer 125 connects the metal layer 112 and the first conductive layer 123 electrically, enabling the first conductive layer 123 to work as a probe pad. The thickness of the second conductive layer 125 may be, for example, around 1 micrometer or larger than 1 micrometer. Optionally, the layer 125 may include a metallic material such as W, Co, Cu, Al, or a combination thereof. As the metal layer 112 is used to connect to a probe pad, the metal layer 112 may be referred to as a contact element. The term "contact element" as used herein indicates a conductive member (or conductor) that is connected to a metal layer electrically and used to contact the metal layer.

In some cases, the bottom surface of the opening 124 includes the exposed surface of the metal layer 112 and a surface of the dielectric region 114. In these cases, the second conductive layer 125 may be deposited to cover the entire bottom surface of the opening 124, making the second conductive layer 125 contact the metal layer 112. Alternatively, the second conductive layer 125 may be deposited to cover and contact a selected portion of the bottom surface of the opening 124, such as a part of the exposed surface of the metal layer 112.

In some other cases, the bottom surface of the opening 124 includes the exposed surface of the metal layer 112, an exposed surface of another metal layer, and a surface of the dielectric region 114. In these cases, the locations of the two metal layers at the bottom of the opening 124 are identified before the deposition process. The second conductive layer 125 may be deposited to cover and contact the exposed surface of the metal layer 112 without covering and contacting the other metal layer.

In some cases, the metal layer 112 contains Cu and the second conductive layer 125 contains W. As the opening 124 exposes a Cu layer (i.e., the metal layer 112), the layer 125 may be deposited to cover the entire exposed surface of the metal layer 112 to prevent Cu from diffusing or migrating from the layer 112 to other regions.

As illustrated above, since the metal layer 112 is exposed through the substrate 111 from the back side, metal layers over the layer 112 on the front side do not need to be cut and then repaired. Hence, investigations of the device 100 may be performed using an FIB system and a PFIB system, and there is no need for a specialized equipment that cuts and reconnects metal layers.

When a metal layer is configured over a non-functional region, such as the metal layer 112 shown in FIGS. 1B-1C, the metal layer may be suitable for reach from the back side of the substrate. However, if a metal layer is configured over a functional region, exposing the metal layer from the back side may damage the functional region. In addition, if a metal layer is configured over a non-functional region whose width is too narrow, an adjacent functional region may be disturbed or damaged when an opening is made to expose the metal layer through the narrow non-functional region. In following descriptions, contact elements are configured to facilitate investigations from the back side and avoid disturbing or damaging adjacent functional regions.

Figure 9A:
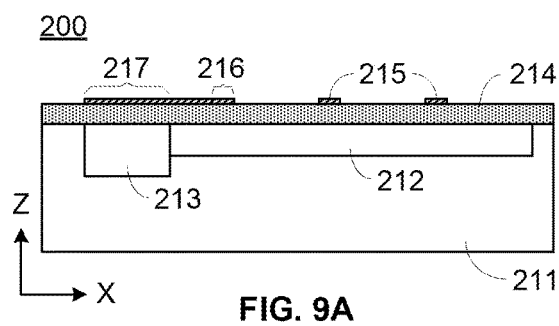
FIGS. 9A-9B are a cross-sectional view and a top view of a semiconductor device illustrating a contact element according to various aspects of the present disclosure.
Figure 9B:
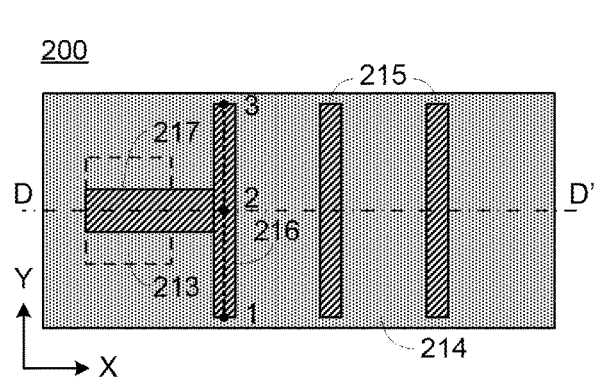

FIGS. 9A and 9B show a cross-sectional view and a top view of a semiconductor device 200 according to aspects of the present disclosure. The top view is in an X-Y plane. The cross-sectional view is in an X-Z plane and taken along a line DD' of the top view. The device 200 includes a substrate 211 that may include single crystalline silicon or another semiconductor material. In descriptions below, the substrate 211 contains single crystalline silicon exemplarily. Similar to the device 100 shown in FIGS. 1A-1C, the device 200 has functional objects such as ICs (not shown) fabricated on the front side of the substrate 211. A first region 212 in the substrate 211 contains multiple functional regions. Optionally, the first region 212 may contain both functional regions and non-functional regions. A second region 213 is a non-functional region and disposed adjacent to the first region 212. The second region 213 has dimensions larger than certain values along the X and Y directions, and is depicted in dashed lines in FIG. 9B for reference, as the region 213 is not visible in the top view. Other functional regions and non-functional regions in the substrate 211 are omitted for simplicity. A dielectric layer 214 is formed over the regions 212 and 213. Metal layers 215 and 216 are deposited on the dielectric layer 214. Optionally, the layers 215-216 may include a metallic material such as W, Co, Cu, Al, or a combination thereof. The metal layers 215-216 are formed on the same level along the Z direction with respect to the substrate 211. Over the layers 215-216, there may be other metal layers formed at higher levels with respect to the substrate 211. The metal layers at higher levels are omitted from FIGS. 9A-9B for simplicity.

Provided that the metal layer 216 is selected as a candidate for contact for potential investigations such as failure analysis from the back side. The trace or route of the metal layer 216 is depicted schematically by a dotted line going through points 1, 2, and 3. As the metal layer 216 is over the first region 212 that may not be suitable for milling an opening, and the non-functional second region 213 is relatively close to the layer 216, a contact element 217 is configured, as shown in FIGS. 9A-9B. The contact element 217 and the layers 215-216 may contain the same conductive material, be formed on the same level with respect to the substrate 211, and deposited with the same method at the same time.

The contact element 217 is aligned with the non-functional second region 213 along the Z direction or a direction approximately perpendicular to the substrate 211. A portion of the dielectric region 214 separates the contact element 217 and second region 213 along the Z direction or a direction approximately perpendicular to the substrate. Optionally, there may be more dielectric materials or layers between the contact element 217 and nonfunctional region 213 along the Z direction. In some embodiments, the contact element 217 is wider than the layer 216 in the X-Y plane, electrically connected to the layer 216, and may be considered as attached to the metal layer 216 (or attached to the trace of the layer 216). Alternatively, the contact element 217 and the layer 216 may have the same or similar width in the X-Y plane.

The non-functional second region 213 and contact element 217 have lateral dimensions (i.e., dimensions in an X-Y plane) larger than certain values, respectively. As such, an opening may be milled through the second region 213 to expose the contact element 217 when needed, which facilitates testing of the device 200 through the substrate 211.

Figure 10A:
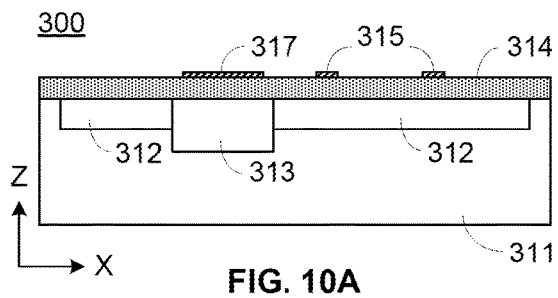
FIGS. 10A-10B are a cross-sectional view and a top view of a semiconductor device illustrating a contact element according to various aspects of the present disclosure.
Figure 10B:
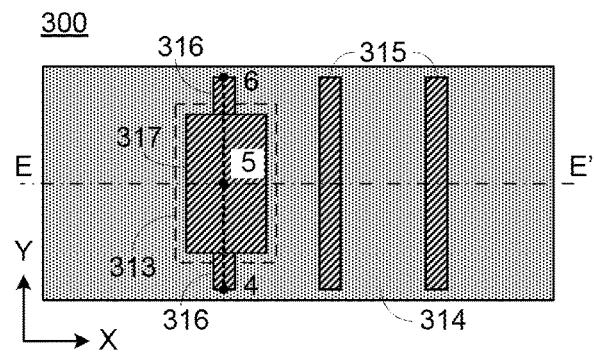

FIGS. 10A and 10B show a cross-sectional view and a top view of a semiconductor device 300 according to aspects of the present disclosure. The top view is in an X-Y plane. The cross-sectional view is in an X-Z plane and taken along a line EE' of the top view. The device 300 includes a substrate 311 that may include single crystalline silicon exemplarily. On the front side of the substrate 311, functional objects such as ICs (not shown) are fabricated. First regions 312 in the substrate 311 contain functional regions. Optionally, the first regions 312 may contain both functional regions and non-functional regions. A non-functional second region 313 is adjacent to the first regions 312 and has dimensions that are larger than certain values along the X and Y directions. The non-functional second region 313 is not visible in the top view and depicted in dashed lines in FIG. 10B for reference. The substrate 311 also contains other functional regions and non-functional regions that are omitted for simplicity. A dielectric layer 314 is formed over the regions 312 and 313. Metal layers 315 and 316 are deposited on the dielectric layer 314. Optionally, the layers 315-316 may include a metallic material such as W, Co, Cu, Al, or a combination thereof. The metal layers 315-316 are formed on the same level along the Z direction with respect to the substrate 311. The device 300 may contain other metal layers formed at higher levels with respect to the substrate 311. The metal layers at higher levels over the layers 315-316 are omitted from FIGS. 10A-10B for simplicity.

Provided that the metal layer 316 is selected as a candidate for contact for potential investigations such as failure analysis from the back side. The trace or route of the metal layer 316 is depicted schematically by a dotted line going through points 4, 5, and 6. As the metal layer 316 is located over the non-functional second region 313, and the region 313 is suitable for milling an opening, a portion of the metal layer 316 is used for constructing a contact element 317, as shown in FIGS. 10A-10B. The contact element 317 and the layers 315-316 may contain the same conductive material, be fabricated on the same level with respect to the substrate 311, and deposited with the same method at the same time.

The contact element 317 is aligned with the non-functional second region 313 along the Z direction or a direction approximately perpendicular to the substrate 311. A portion of the dielectric region 314 separates the contact element 317 and second region 313 along the Z direction or a direction approximately perpendicular to the substrate. Optionally, there may be more dielectric materials or layers between the contact element 317 and second region 313 along the Z direction. In some embodiments, the contact element 317 is wider than the layers 315-316 in the X-Y plane (or wider than a portion of the metal layer 316 that is adjacent or proximate to the contact element 317), electrically connected to the layer 316, and may be considered as a part of the metal layer 316. Alternatively, the contact element 317 and the layer 316 may have the same or similar width in the X-Y plane. In addition, the trace of the layer 316 passes through the contact element 317.

In certain cases, the spacing between the metal layer 316 and an adjacent metal layer 315 is smaller than a predetermined value. When an opening is etched to expose the contact element 317, the opening may expose an adjacent metal layer 315. To reduce the risk of exposing an adjacent metal layer, the spacing between the metal layer 316 and the adjacent metal layer 315 may be enlarged to make it bigger than the predetermined value in areas around the contact element 317.

The non-functional second region 313 and contact element 317 have lateral dimensions (i.e., dimensions in an X-Y plane) larger than certain values, respectively. When needed, an opening may be cut through the second region 313 to expose the contact element 317. As such, the method facilitates investigations of the device 300 from the back side.

Figure 11A:
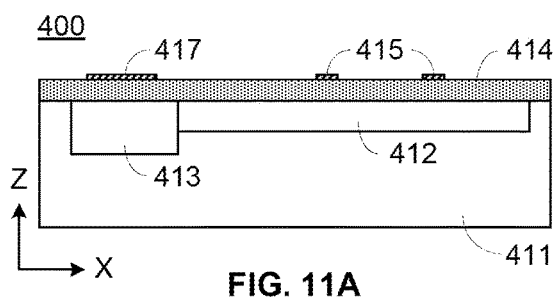
FIGS. 11A-11B are a cross-sectional view and a top view of a semiconductor device illustrating a contact element according to various aspects of the present disclosure.
Figure 11B:
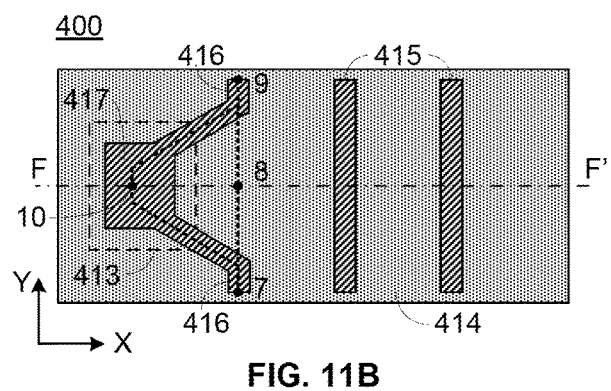

FIGS. 11A and 11B show a cross-sectional view and a top view of a semiconductor device 400 according to aspects of the present disclosure. The top view is in an X-Y plane. The cross-sectional view is in an X-Z plane and taken along a line FF' of the top view. The device 400 includes a substrate 411 of single crystalline silicon exemplarily. On the front side of the substrate 411, functional objects such as ICs (not shown) are fabricated. A first region 412 in the substrate 411 contains functional regions. Optionally, the first region 412 may contain functional regions and non-functional regions. A non-functional second region 413 is adjacent to the first region 412 and has dimensions that are larger than certain values along the X and Y directions. The non-functional second region 413 is not visible in the top view and depicted in dashed lines in FIG. 11B for reference. The substrate 411 also contains other functional regions and non-functional regions that are omitted for simplicity. A dielectric layer ix) 414 is deposited over the regions 412 and 413. Metal layers 415 and 416 are deposited on the dielectric layer 414. Optionally, the layers 415-416 may include a metallic material such as W, Co, Cu, Al, or a combination thereof. The metal layers 415-416 are on the same level along the Z direction with respect to the substrate 411. The device 400 may contain other metal layers formed at higher levels with respect to the substrate 411. The metal layers at higher levels over the layers 415-416 are omitted in FIGS. 11A-11B for simplicity.

Provided that the metal layer 416 is selected as a candidate for contact for potential investigations such as failure analysis from the back side. Under conventional design rules, the trace of the metal layer 416 would be a line through points 7, 8, and 9, as shown by a schematic dotted line in FIG. 11B. As the metal layer 416 is over the first region 412 that may not be suitable for milling an opening, and the non-functional second region 413 is relatively close to the metal layer 416, a detour may be configured such that the trace of the layer 416 passes a region that is aligned with the second region 413 along the Z direction. The detour route is depicted by a dotted line that connects points 7, 10, and 9. Then, a contact element 417 may be configured that is aligned with the second region 413, and may be attached to the detour portion of the layer 416 or be an enlarged part of the layer 416 as shown in FIG. 11B. The contact element 417 and the layers 415-416 may contain the same conductive material, be formed on the same level with respect to the substrate 411, and deposited with the same method at the same time.

The contact element 417 is aligned with the non-functional second region 413 along the Z direction or a direction approximately perpendicular to the substrate 411. A portion of the dielectric region 414 separates the contact element 417 and second region 413 along the Z direction or a direction approximately perpendicular to the substrate. Optionally, there may be more dielectric materials or layers between the contact element 417 and second region 413 along the Z direction. In some embodiments, the contact element 417 is wider than the layers 415-416 in the X-Y plane (or wider than a portion of the metal layer 416 that is adjacent or proximate to the contact element 417), and electrically connected to the layer 416. Alternatively, the contact element 417 and the layer 416 may have the same or similar width in the X-Y plane. In addition, the trace of the layer 416 passes through the contact element 417 along the detour.

The non-functional second region 413 and contact element 417 have lateral dimensions (i.e., dimensions in an X-Y plane) larger than certain values. When needed, an opening may be etched through the region 413 to expose the contact element 417 for testing the device 400.

Figure 12A:
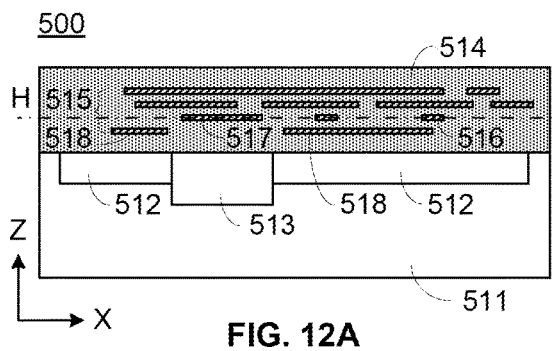
FIGS. 12A-12B are cross-sectional views of a semiconductor device illustrating a contact element according to various aspects of the present disclosure.
Figure 12B:
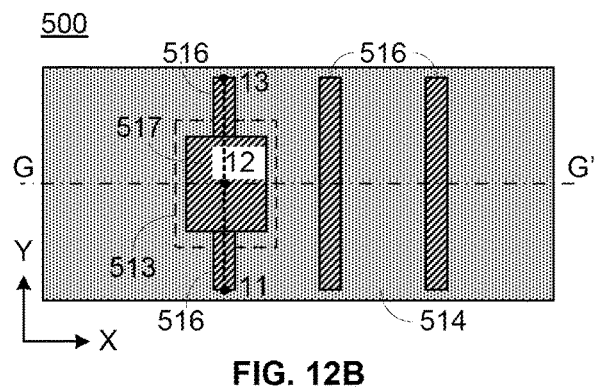

FIGS. 12A and 12B show two cross-sectional views of a semiconductor device 500 according to aspects of the present disclosure. The cross-sectional view in FIG. 12A is in an X-Z plane and taken along a line GG' of the cross-sectional view in FIG. 12B. The cross-sectional view in FIG. 12B is in an X-Y plane and taken along a line HH' of the view in FIG. 12A. The device 500 includes a substrate 511 of single crystalline silicon exemplarily. On the front side of the substrate 511, functional objects such as ICs (not shown) are fabricated. First regions 512 in the substrate 511 contain functional regions. Optionally, the first regions 512 may contain functional regions and non-functional regions. A non-functional second region 513 is adjacent to the first regions 512 and has dimensions that are larger than certain values along the X and Y directions. The non-functional second region 513 is not visible in the cross-sectional view of the X-Y plane and depicted in dashed lines in FIG. 12B for reference. The substrate 511 also contains other functional regions and non-functional regions that are omitted for simplicity. A dielectric region 514 is deposited over the regions 512 and 513. Metal layers 515 are deposited at different levels with respect to the substrate 511 in the dielectric region 514. Optionally, the layers 515 may include a metallic material such as W, Co, Cu, Al, or a combination thereof. The metal layers 515 include layers 516, 517, and 518. Metal layers 516-517 are on the same level along the Z direction with respect to the substrate 511. The metal layers 518 are disposed at a lower level than the layers 516-517 and between the layers 516-517 and the regions 512-513.

Provided that the metal layer 516 is selected as a candidate contact for potential investigations such as failure analysis from the back side. The trace of the metal layer 516 is depicted schematically by a dotted line going through points 11, 12, and 13. As the metal layer 516 is located over the non-functional second region 513, and the second region 513 is suitable for milling an opening, a portion of the metal layer 516 is used for constructing a contact element 517, as shown in FIGS. 12A-12B. The contact element 517 and the layers 515-516 may contain the same conductive material, be formed on the same level with respect to the substrate 511, and deposited with the same method at the same time.

The contact element 517 is aligned with the non-functional second region 513 along the Z direction or a direction approximately perpendicular to the substrate 511. In some embodiments, the contact element 517 superimposes with a part of the second region 513 along the Z direction or a direction approximately perpendicular to the substrate 511. Being at a level lower than the contact element 517, the metal layers 518 should avoid the region beneath the contact element 517 or between the contact element 517 and second region 513. In other words, the metal layers 518 are formed outside the region beneath the contact element 517 or the region between the contact element 517 and second region 513. As such, a portion of the dielectric region 514 separates the contact element 517 and second region 513 along the Z direction or a direction approximately perpendicular to the substrate. Optionally, there may be more dielectric materials or layers between the contact element 517 and second region 513 along the Z direction. In some embodiments, there are only dielectric materials between the contact element 517 and second region 513 along the Z direction or a direction approximately perpendicular to the substrate. The contact element 517 is wider than the layers 515-516 in the X-Y plane (or wider than a portion of the metal layer 516 that is adjacent or proximate to the contact element 517), electrically connected to the layer 516, and may be considered as a part of the metal layer 516. In addition, the trace of the layer 516 passes through the contact element 517.

The second region 513 and contact element 517 have lateral dimensions (i.e., dimensions in an X-Y plane) larger than certain values, respectively. As such, an opening may be etched through the second region 513 to reach and expose the contact element 517. When there is a need, investigations of the device 500 may be performed from the back side of the substrate 511.

The semiconductor devices 200, 300, 400, and 500, as illustrated above, may reflect a portion of a semiconductor device, respectively. The devices 200-500 may also be viewed as a semiconductor structure, respectively.

Figure 13:
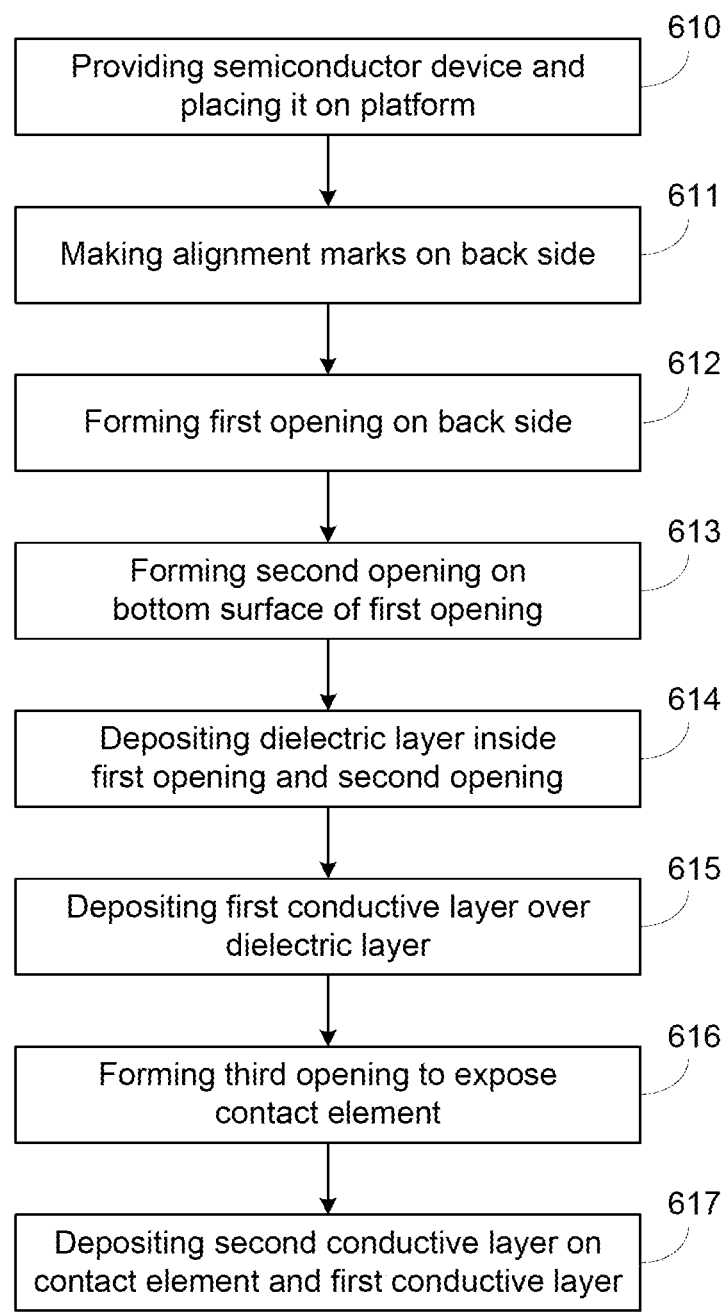
FIG. 13 is a schematic flow chart illustrating processes to expose a contact element of a semiconductor device according to various aspects of the present disclosure.

FIG. 13 shows a schematic flow chart 600 for exposing a contact element of a semiconductor device from the back side according to aspects of the present disclosure. At 610, a semiconductor device is provided for investigations. The device includes a semiconductor substrate, such as a substrate of single crystalline silicon. Certain ICs are made on the front side of the substrate. There is a dielectric region deposited over the front side. Metal interconnect layers including a contact element at the bottom level (or the lowest level) are disposed in the dielectric region. The contact element is electrically connected with a selected metal interconnect layer and arranged to be exposed for investigations of the semiconductor device.

At 611, the semiconductor device is fixed on a platform with the back side facing upwards. If the thickness of the substrate is larger than a predetermined value (e.g., 100 micrometers), a thinning process may be performed to make the thickness around 100 micrometers. An IR optical microscope is used to take images of the ICs. The images and the layout of the ICs are used to determine locations of the contact element and alignment marks. The alignment marks are created on the back side of the substrate by, e.g., an engraving method.

At 612, a location of a first opening is determined using the alignment marks, the location of the contact element, and the layout of the ICs. The first opening is formed by milling on the back side of the substrate using, e.g., a PFIB system. The thickness of the remaining part of the substrate at the bottom of the first opening is around a predetermined value or larger than a predetermined value to avoid disturbing functional regions in the substrate.

At 613, the IR optical microscope and an optical microscope in the visible light range are used to take images of the ICs through the bottom surface of the first opening. Based on the images and the layout of the ICs, the location of the contact element is double checked. Then, a location of a second opening is determined using the location of the contact element. The second opening is etched on the bottom surface of the first opening by, e.g., an FIB system. The second opening cuts through the bottom surface of the first opening, extends through a portion of the substrate between the bottom surface and the dielectric region, and exposes a surface of the dielectric region at the bottom of the second opening.

At 614, a dielectric layer is deposited on the bottom surface of the first opening and the sidewall of the second opening. Optionally, an FIB-assisted deposition is performed. In some embodiments, the dielectric layer may cover a portion of the bottom surface of the first opening and a portion of the sidewall of the second opening. Alternatively, the dielectric layer may cover a portion of the bottom surface of the first opening and the entire sidewall of the second opening. The dielectric layer contains a dielectric material such as silicon oxide or silicon nitride.

At 615, a first conductive layer is formed on the dielectric layer via, e.g., FIB-assisted deposition. The first conductive layer is deposited over portions of the dielectric layer that are on the bottom surface of the first opening and the sidewall of the second opening. The first conductive layer may contain a metallic material (e.g., W, Co, Cu, Al, or a combination), and is isolated from the substrate by the dielectric layer.

At 616, a third opening is made on the bottom surface of the second opening using, e.g., an FIB system. The third opening cuts through the bottom surface of the second opening, extends through a portion of the dielectric region below the bottom surface of the second opening, and exposes a surface of the contact element at the bottom of the third opening.

At 617, a second conductive layer is grown on the exposed surface of the contact element and a portion of the first conductive layer that is proximate to the third opening. The second conductive layer may contain a metallic material (e.g., W, Co, Cu, Al, or a combination), and connects the contact element with the first conductive layer electrically.

As the first conductive layer is connected to the contact element electrically, a portion of the first conductive layer on the bottom surface of the first opening may be used as a probe pad. A tip of a probe may be maneuvered to touch and contact the probe pad. When the ICs are stimulated, signals may be detected by the probe and used to diagnose the semiconductor device.

Because the contact element is at the bottom level and exposed through the substrate from the back side, metal layers over the contact element at higher levels are spared when the opening is milled. Thus, investigations may be performed without cutting and repairing metal layers by high-performance equipment.

Although the principles and implementations of the present disclosure are described by using specific aspects in the specification, the foregoing descriptions of the aspects are only intended to help understand the present disclosure. In addition, features of aforementioned different aspects may be combined to form additional aspects. A person of ordinary skill in the art may make modifications to the specific implementations and application range according to the idea of the present disclosure. Hence, the content of the specification should not be construed as a limitation to the present disclosure.

What is claimed is:

1. A structure for performing analysis, comprising:
   a first opening, formed on a back side of a substrate, and passing through the substrate;
   a second opening, connected with a bottom of the first opening, and penetrating into a first dielectric layer formed on a front side of the substrate;
   a first conductive layer, formed on a sidewall of the second opening and on a contact element in the first dielectric layer; and
   a second conductive layer formed on a second dielectric layer, wherein the second dielectric layer is formed on a sidewall of the first opening, and the first conductive layer contacts the second conductive layer electrically.

2. The structure according to claim 1, wherein first opening is connected with a bottom of a third opening formed on the back side of the substrate.

3. The structure according to claim 2, wherein the second dielectric layer is further formed over a bottom surface of the third opening.

4. The structure according to claim 1, wherein the first conductive layer is further formed over a bottom surface of the second opening.

5. The structure according to claim 1, wherein the first conductive layer is further formed on the second conductive layer.

6. The structure according to claim 1, further comprising:
   a plurality of marks on the back side of the substrate.

7. A method for analyzing a semiconductor structure, comprising:
   placing the semiconductor structure on a platform, wherein the semiconductor structure includes a substrate, one or more functional objects are formed on a front side of the substrate, and the front side and a back side of the substrate face oppositely along a direction approximately perpendicular to the substrate;
   removing a portion of the substrate from the back side to form a first opening with a bottom surface at a bottom of the first opening;
   forming a second opening on the bottom surface that extends through the substrate, the second opening exposing a surface of a dielectric region at a bottom of the second opening;
   depositing a dielectric layer over the bottom surface of the first opening and a sidewall of the second opening;
   depositing a first conductive layer over the dielectric layer;
   forming a third opening on the surface of the dielectric region that extends through a portion of the dielectric region, the third opening exposing a surface of a contact element at a bottom of the third opening; and
   depositing a second conductive layer on the contact element and the first conductive layer to connect the contact element and the first conductive layer electrically.

8. The method according to claim 7, further comprising:
   before forming the first opening, forming a plurality of marks on the back side of the substrate; and
   determining a location of the first opening on the back side using the plurality of marks.

9. The method according to claim 7, further comprising:
   before forming the second opening, determining a location of the contact element.

10. The method according to claim 7, wherein the second opening passes through a non-functional region in the substrate.

11. The method according to claim 7, wherein the second opening is surrounded by a dielectric material in a plane approximately parallel to the substrate.

12. The method according to claim 7, wherein depositing the second conductive layer on the contact element comprises:
    depositing the second conductive layer on an entire exposed surface of the contact element.

13. The method according to claim 7, wherein a distance between the bottom surface of the first opening and the dielectric region is larger than a predetermined value.

14. The method according to claim 7, wherein the first conductive layer, second conductive layer, and/or the contact element comprises one or more metallic materials.

15. A semiconductor structure, comprising:
    a substrate;
    a functional region including a functional object formed on a front side of the substrate;
    a non-functional region formed on the front side of the substrate;
    a dielectric region formed over the non-functional region;
    a conductive layer in the dielectric region for interconnection of the functional object; and
    a contact element comprising a conductive material, located in the dielectric region, connected with the conductive layer electrically, and aligned with the non-functional region along a direction approximately perpendicular to the substrate, wherein the contact element and the non-functional region are separated by a portion of the dielectric region along the direction approximately perpendicular to the substrate, and a width of the contact element is larger than a width of a portion of the conductive layer.

16. The semiconductor structure according to claim 15, wherein the contact element is attached to a trace of the conductive layer.

17. The semiconductor structure according to claim 15, wherein a trace of the conductive layer passes through the contact element.

18. The semiconductor structure according to claim 17, wherein a detour of the trace passes through the contact element.

19. The semiconductor structure according to claim 15, wherein the portion of the conductive layer is proximate to the contact element.

20. The semiconductor structure according to claim 15, wherein the conductive layer comprises the conductive material.

* * * * *